United States Patent [19]

Muroyama

[11] Patent Number: 5,767,016
[45] Date of Patent: Jun. 16, 1998

[54] METHOD OF FORMING A WIRING LAYER ON A SEMICONDUCTOR BY POLISHING WITH TREATED SLURRY

[75] Inventor: Masakazu Muroyama, Kanagawa, Japan

[73] Assignee: Sony Corporation, Tokyo, Japan

[21] Appl. No.: 499,784

[22] Filed: Jul. 7, 1995

[30] Foreign Application Priority Data

Jul. 27, 1994 [JP] Japan .................................. 6-194765

[51] Int. Cl.⁶ .................................. H01L 21/461
[52] U.S. Cl. .................. 438/693; 438/633; 252/79.1; 106/3; 51/308
[58] Field of Search .............. 156/636.1, 639.1; 437/228, 88; 216/88, 89, 91; 438/633, 693; 252/79.1; 106/3; 51/308

[56] References Cited

U.S. PATENT DOCUMENTS

| | | | |
|---|---|---|---|
| 4,992,135 | 2/1991 | Doan | 156/363 |
| 5,378,566 | 1/1995 | Yu | 430/58 |
| 5,505,008 | 4/1996 | Hayakawa et al. | 437/225 |
| 5,525,660 | 6/1996 | Shiono et al. | 524/268 |
| 5,575,837 | 11/1996 | Kodama et al. | 106/3 |
| 5,604,158 | 2/1997 | Cadien et al. | 437/200 |

FOREIGN PATENT DOCUMENTS

| | | | |
|---|---|---|---|
| 06-86187 | 5/1985 | Japan | 3/14 |
| 60086187 | 5/1985 | Japan | 3/14 |

OTHER PUBLICATIONS

Toshihiko Oguchi, "Electrification of Metal Oxide Powder", 1985, Surface Magazine, vol. 23, No. 5.

*Primary Examiner*—R. Bruce Breneman
*Assistant Examiner*—Anita Alanko
*Attorney, Agent, or Firm*—Ronald P. Kananen

[57] ABSTRACT

In forming a wiring layer on a semiconductor stepped substrate (wafer) 15, the wiring layer is polished by using a slurry 12 which contains polishing particles treated in advance with a surface treatment agent containing at least an amino group. During polishing, a uniformity of polishing of the surface of the wafer 15 is maintained by rotating a wafer carrier rotation shaft 17 and a platen rotation shaft 14 while supplying slurry 12 through a guide tube 11. Consequently, scratches are prevented from being caused on surfaces of a multilayer wiring layer and an interlayer insulation film on a semiconductor device and, in addition, the wiring layer can be stably polished.

5 Claims, 4 Drawing Sheets

METHOD OF FORMING A WIRING LAYER ON A SEMICONDUCTOR BY POLISHING WITH TREATED SLURRY

BACKGROUND OF THE INVENTION

1. Field of the Invention

The present invention relates to a slurry for polishing a stepped metal wiring layer used during the formation of metal wiring in a semiconductor device, a method of manufacturing the slurry, and a semiconductor manufacturing method by using the slurry.

2. Description of Related Art

In recent times, wiring technology for semiconductor devices has tended to implement miniaturization and multilayer configuration along with higher density design. However, high density integration may cause deterioration of reliability. This is because interlayer insulation film steps are large and steep which results in a deterioration of processing accuracy and reliability of the wiring to be formed thereon. Therefore, it is necessary to increase the flatness of the interlayer insulation film in view of the fact that it is currently impossible to substantially improve the coverage of the steps of the metal wiring made of materials such as aluminum.

Though various types of insulation film forming technique and flattening techniques have been developed, there have been recurring problems such as insufficiency of the flatness in a case where a wiring interval is large, and defective connection between wirings due to undesired porosity of the interlayer film between the wiring when the above techniques are applied to miniaturized and multilayered wiring layers.

A recent development in this area includes attempts to use a polishing technique for flattening the multilayered wiring. For example, the IBM Damascene Process shown in FIG. 1 is well known. This process results in an interlayer film 2 being formed (FIG. 1B) after a metal wiring layer is formed (FIG. 1A). Via contacts (not shown) for connecting upper and lower wirings are formed by etching an interlayer insulation film 2 which is then flattened by polishing (FIG. 1C). A metal layer 5, such as tungsten, is then formed (FIG. 1D). The metal layer 5 except for that part which fills the etched grooves is removed by the polishing method, thus leaving the embedded metal wiring 5a (FIG. 1E). The above techniques are described in detail in S. Roehl et al, Proc. IEEE Conf., 22 (1992), for example.

When polishing the metal wiring layer, polishing is usually carried out in a relatively acidic medium in order to achieve the desired chemical polishing effect. However, silicon oxide particles that are added to provide a physical polishing effect are often insufficiently dispersed and tend to aggregate in the acid solution. This finding is described in detail, for example, in the magazine "Surface" vol. 23, No. 5 (1985). Therefore, there is a concern that defects such as scratches due to silicon oxide aggregates will be formed on the wiring layer and the interlayer insulation film when the wiring layer is being polished.

In light of this, a method has been developed to reduce aggregation and improve dispersion in the acid solution by using an oxide having a basic surface. However, an oxide, such as alumina, having this basic surface has a high surface hardness and therefore may also cause scratches on the wiring layer and the interlayer insulation film.

SUMMARY OF THE INVENTION

A first object of the present invention is to provide a technique for flattening a multilayer wiring of a semiconductor device.

A second object of the present invention is to provide a polishing technique for flattening a multilayer wiring of a semiconductor device.

A third object of the present invention is to provide a polishing technique for controlling formation of scratches on multiple wiring layer and interlayer insulation film surfaces of a semiconductor device which results in a stable polishing of the wiring layer.

The present inventor found a method for controlling the so-called scratches which tend to be caused during the polishing of a wiring layer.

The above objects of the present invention are attained by a configuration as described below.

Specifically, a manufacturing method of a semiconductor device is disclosed which includes the steps of holding a semiconductor substrate having a stepped metal wiring layer in position, having a polishing plate contact the surface side of the stepped metal wiring layer of the substrate, and polishing the wiring layer surface while supplying a slurry containing surface-treated polishing particles.

In the method of manufacturing semiconductor devices according to the present invention, it is preferable to use a slurry which contains polishing particles having a basic surface layer. Therefore, an organic silicon compound which contains at least one amino group can be used as a surface treating agent for the surfaces of polishing particles.

The above objects of the present invention are also attained by a configuration as described below.

The slurry for polishing the surface of a stepped wiring layer of a semiconductor substrate contains polishing particles which are pre-surface-treated.

It is preferable to use a slurry which contains polishing particles on the surfaces of which have a basic layer for polishing the surface of the stepped wiring layer of the semiconductor substrate according to the present invention. An organic silicon compound which contains at least one amino group can be used as a surface treating agent for the polishing particles. In addition, a solution treatment method can be used as the surface treating method.

Particularly, the present invention can be used to form an embedded wiring layer by polishing a metal wiring layer using a so-called polishing method.

Dispersibility of the oxide particles used as a component of a slurry for polishing stepped surfaces of metal wiring layers in semiconductor devices greatly depends on the characteristics of the particle surface and the characteristics of the solution in which the particles are dispersed. The particles must exhibit a low tendency to aggregate on silicon oxide film in an acid solution and have a relatively low surface hardness. According to the invention, the surface treatment of the particles renders their surface potential negative. Accordingly, a repulsive force between particles in acidic solution increases, and the dispersibility of the particles is improved. Therefore, the particle dispersibility in an acid solution is high and the surfaces of the metal wiring layer and the interlayer insulation film are prevented from being scratched.

DETAILED DESCRIPTION OF THE PREFERRED EMBODIMENTS

Preferred embodiments of the present invention are described below.

Figure 1A:
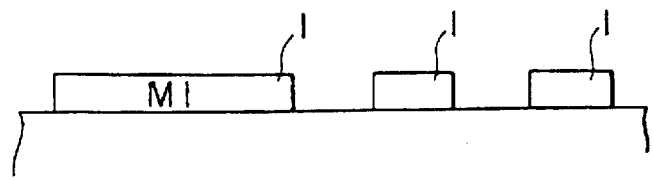
FIGS. 1A to 1E are diagrams illustrating a process for polishing a common metal wiring layer according to the related art.
Figure 1B:
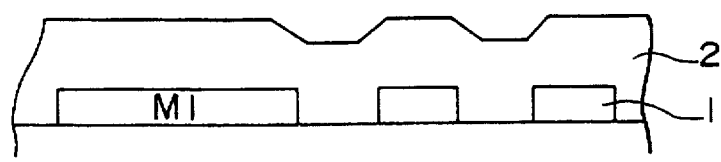
Figure 1C:
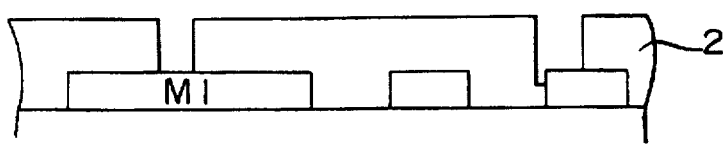
Figure 1D:
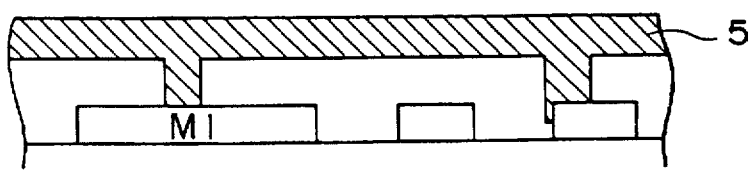
Figure 1E:
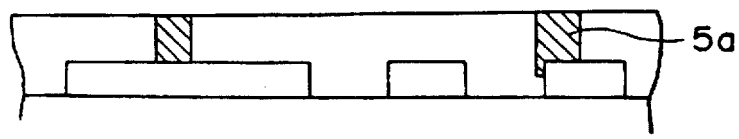
Figure 2:
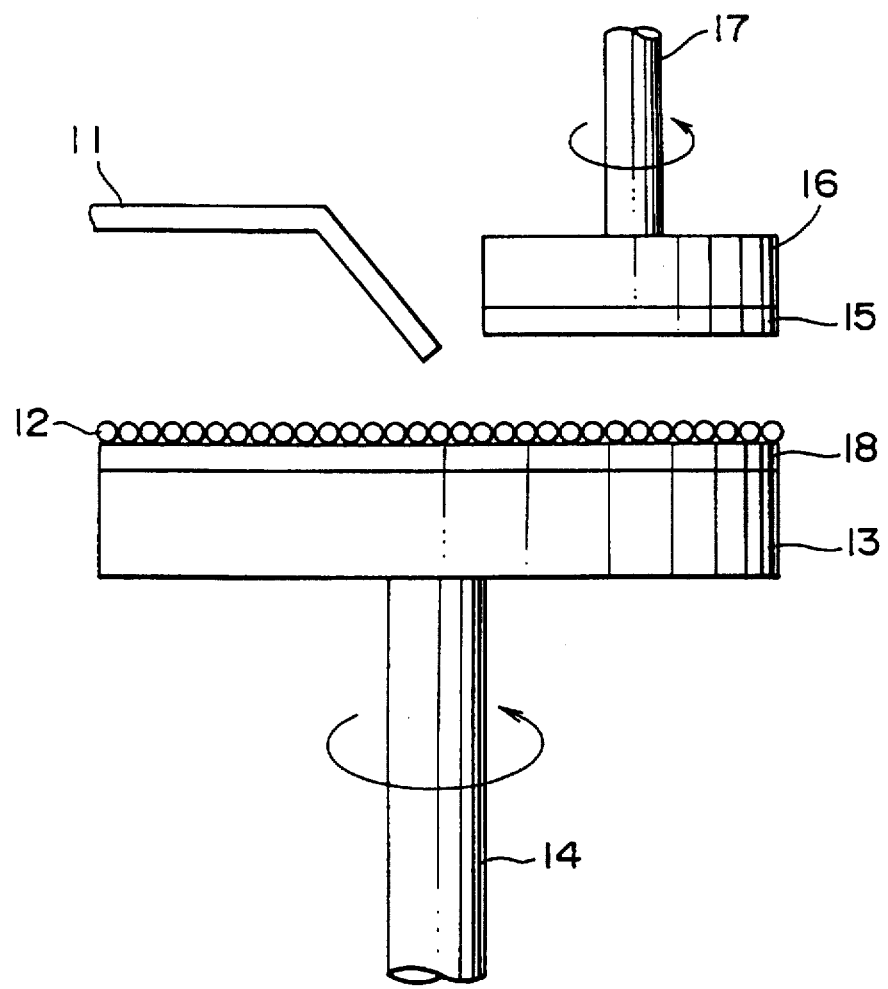
FIG. 2 is a schematic diagram of a polishing unit to be used in a fourth embodiment of the present invention.

Prior to the description of a polishing process for polishing a surface of an actual semiconductor substrate, a configuration of a polishing unit, in which a first embodiment of the present invention is used, is described with reference to FIG. 2. In this case, a single wafer polishing unit is taken up for description as the above polishing unit. Variations as to a construction for loading a wafer and a method of use are not limited to those disclosed herein.

A wafer 15 is fixed by a vacuum chuck to a wafer carrier 16 having a wafer carrier rotation shaft 17. A pad 18 is fixed to a polishing plate (platen) 13 and slurry 12 is supplied to the pad 18 through a slurry guide tube 11. The wafer 15 and the pad 18 are arranged to oppose each other and are respectively provided with the wafer carrier rotation shaft 17 and a platen rotation shaft 14.

During the polishing operation, the wafer carrier rotation shaft 17 at the upper side, and the platen rotation shaft 14 at the lower side, are rotated to maintain uniform polishing of the surface of the wafer 15. A pressure for holding the wafer 15 during polishing is applied by controlling a force to be applied to the wafer carrier 16.

A first embodiment of the present invention is described below.

Figure 3:
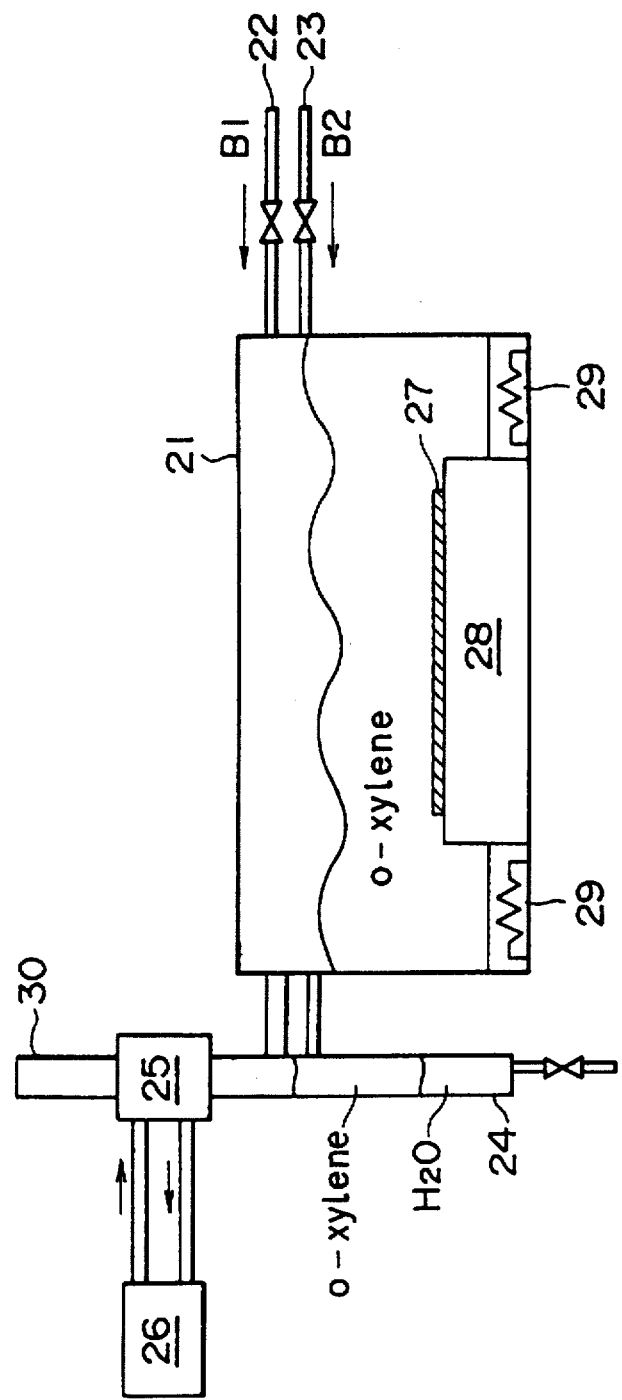
FIG. 3 is a schematic diagram of a solution reacting unit for a polishing slurry in a first embodiment of the present invention.

Prior to the description of a surface treatment process, the construction of a solution reacting unit used to treat the surfaces of particles in accordance with the present invention and the method of treatment, are described with reference to FIG. 3.

A guide tube 22 for introducing an organic metallic compound (for example, γ-aminopropyl triethoxy silane; $NH_2C_3H_6Si(OC_2H_5)_3$) from a direction indicated by arrow B1 and a guide tube 23 for introducing a solvent (o-xylene) from a direction indicated by arrow B2 are provided on a side wall of a reaction container 21. A heater 29 for heating a reaction solution is buried in the reaction container 21. A discharging tube 30 for guiding vaporized solvent is connected to the side wall of the reaction container 21 and provided with a trap 24 and a cooler 25. A coolant is supplied to the cooler 25 from a heat exchanger 26. The solvent, condensed and separated by the cooler 25, is collected to the lower part of the discharging tube 30. Water which is immiscible in the solvent is separated into the trap 24.

An example of a process according to a second embodiment of the present invention is described below.

First of all, slurry to be used for forming a wiring layer on a substrate having steps and polishing the wiring layer is obtained. Particularly, this embodiment is used for forming a wiring layer made of tungsten (W) which is filled into grooves formed in the interlayer insulation film.

Oxide particles (silicon oxide) are first added into the reaction container 21 and a hydrophobic solvent such as, for example, orthoxylene (o-xylene; boiling point 145° C.) is introduced into the reaction container 21 through the guide tube 23 to a level where the oxide particles are immersed. At this time, the temperature of the solvent is maintained at the boiling point of 145 ° C. by the heater 29. Water adsorbed on the surfaces of oxide particles is vaporized together with the solvent and liquefied by the cooler 25. In this case, adsorbed water which is not dissolved in orthoxylene is separated into the trap 24 according to a specific gravity difference.

Under these conditions, the solution is allowed to reflux for about one hour until all the adsorbed water is removed. If any water remains on the surfaces of oxide particles, an undesired effect results wherein an organic metal alkoxide such as γ-aminopropyl triethoxy silane which is added in the next step of forming the surface treatment layer, undesirably reacts and the surface treated layer cannot be stably formed.

After removing water collected in the trap 24 through the drain, a surface treated layer is formed by introducing γ-aminopropyl triethoxy silane through the guide tube 22 and refluxing it at 145° C.

After this, formation of particles of a surface treated oxide film is completed by cleaning with a hydrophobic solvent such as hexane.

A solvent which is hydrophobic and has a higher boiling point than alcohol and surface adsorption water can be selected. For example, orthoxylene and cyclooctanon can be used.

The following describes the procedures for obtaining a semiconductor device by forming a wiring layer on a substrate of a semiconductor integrated circuit. This embodiment represents an example in which a metal wiring layer made of tungsten (W) is formed in connection holes formed in the interlayer insulation film.

Figure 4A:
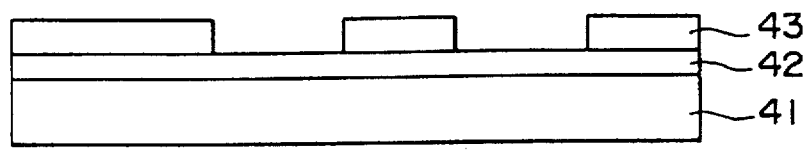
FIGS. 4A to 4E are diagrams showing a manufacturing process for manufacturing a semiconductor device according to second and third embodiments of the present invention.
Figure 4B:
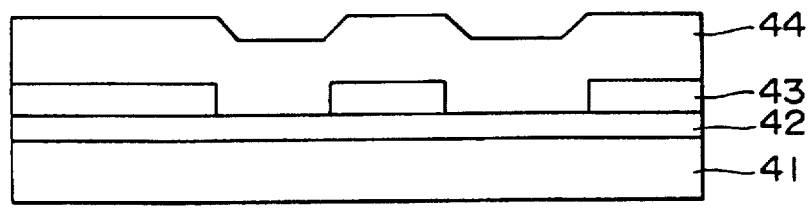

An interlayer insulation film (silicon oxide) 42 and a wiring layer are formed on a semiconductor substrate 41 comprising silicon 43. The wiring layer 43 is etched using a resist process (FIG. 4A). After this, an interlayer insulation film 44 is formed by a routine method as shown in FIG. 4B.

Figure 4C:
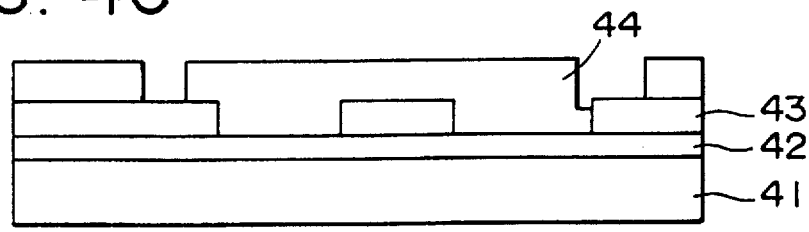

After processing the interlayer insulation film 44 by a routine polishing method as shown in FIG. 4C, the connection holes are formed by etching.

Figure 4D:
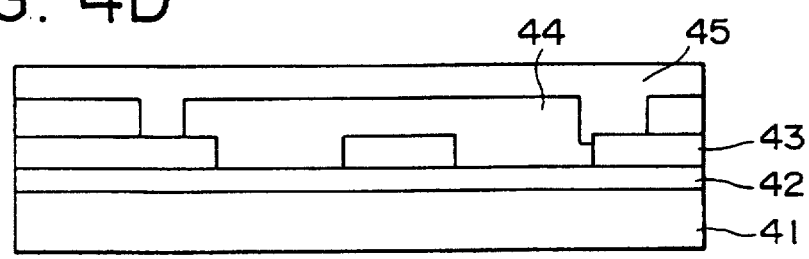
Figure 4E:
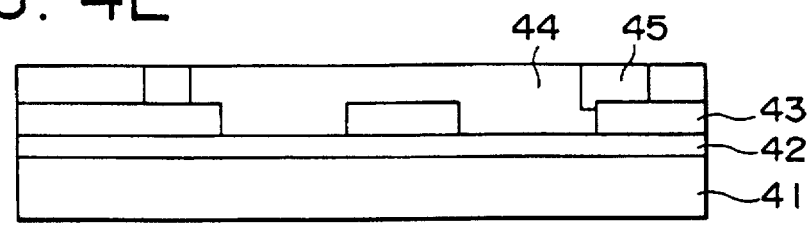

After forming a metal wiring layer 45 as shown in FIG. 4D, the filled connection holes are exposed by polishing off the excess metal as shown in FIG. 4E.

In this case, silicon oxide polishing particles used are surface-treated with γ-aminopropyl triethoxy silane as the surface treatment agent using the above-described solution reaction method.

The polishing conditions for W of the metal wiring layer 45 are as follows:

| Polishing conditions for W: | |
| --- | --- |
| Rotation rate of the platen 23: | 17 rpm |
| Rotation rate of the wafer carrier: | 17 rpm |
| Polishing pressure: | $5.5 \times 10^3$ Pa |
| Flow rate of slurry: | 225 ml/min |
| Slurry content: | Surface-treated polishing particles $K_3[Fe(CN)_6]$ + $KH_2PO_4$ aqueous solution pH = 5.0 |

The slurry is removed by cleaning with water after completion of polishing and the polishing step of the W metal wiring layer 45 is finished. Flattening of the interlayer insulation film 44 is completed by subsequently forming the interlayer insulation film 44 using a routine method.

As a result of evaluating a resistance to scratches, scratches are observed on the surfaces of the W metal wiring layer and the interlayer insulation film when the surfaces are not treated as described above while no scratches are observed when the surfaces are treated as described above.

A third embodiment of the present invention is described below.

In this embodiment the molecular length of the surface treatment agent is increased to provide a steric hinderance and to further improve dispersibility of polishing particles.

Silicon oxide polishing particles used in this embodiment are surface treated using N-2-aminoethyl-3-aminopropyl trimethoxy silane ($NH_2C_2H_4NHC_3H_6Si(OCH_3)_3$). The same solution reaction method used in the first embodiment is also used in this embodiment.

A metal wiring layer comprising tungsten (W) is formed to fill connection holes formed in the same interlayer insulation film as in the second embodiment shown in FIG. 4. The W wiring layer is then polished under the same conditions as used in the second embodiment.

The slurry is removed by cleaning with water after completion of polishing and the polishing step of the wiring is finished.

Subsequently, flattening of the interlayer insulation film is completed by forming an interlayer insulation film, not shown, using a routine method.

As a result of evaluating a resistance to scratch, scratches are observed on the surfaces of the W metal wiring layer and the interlayer insulation film when the surfaces are not treated, while no scratches are observed both surfaces of the W metal wiring layer and the interlayer insulation film insulation film when the surfaces are treated.

The surface treatment agents used in the above embodiments include γ-aminopropyl triethoxy silane and N-2-aminoethyl-3-aminopropyl trimethoxy silane but can be changed appropriately if the agent containing at least one amino group is used. For example, 4-aminobutyl dimethyl methoxy silane ($NH_2C_4H_8Si(CH_3)OCH_3$), aminoethyl aminomethyl phenyl trimethoxy silane ($NH_2C_2H_4NHCH_2—C_6H_4—C_2H_4Si(OCH_3)_3$), and N-2-aminoethyl-3-aminopropyl methyldimethoxy silane ($NH_2C_2H_4NHC_3H_6SI(CH_3)_2OCH_3$) may be used.

Polishability of the stepped surface of the metal wiring layer in manufacturing of the semiconductor device is improved and occurrence of scratches on the surfaces of the metal wiring layer and the interlayer insulation film can be controlled.

What is claimed is:

1. A manufacturing method of a semiconductor device comprising the steps of:

holding a semiconductor substrate, making a platen contact the surface of said semiconductor substrate, and carrying out polishing while supplying slurry which contains polishing particles the surfaces of which are treated;

wherein said slurry contains polishing particles on the surfaces of which a basic layer is formed; and wherein the surfaces of said polishing particles are treated by using an organic silicon compound, which contains at least one amino group, as a surface treatment agent for treating the surfaces of polishing particles.

2. A manufacturing method of a semiconductor device according to claim 1, wherein a tungsten wiring is formed on said semiconductor substrate.

3. A manufacturing method of a semiconductor device comprising the steps of:

holding a semiconductor substrate having a stepped surface of a metal wiring layer, making a platen touch said stepped surface of the metal wiring layer formed on said semiconductor substrate, and carrying out polishing while supplying slurry which contains polishing particles the surfaces of which are treated;

wherein said slurry contains polishing particles on the surfaces of which a basic layer is respectively formed; and wherein the surfaces of said polishing particles are treated by using an organic silicon compound, which contains at least one amino group, as a surface treatment agent for treating the surfaces of polishing particles.

4. A manufacturing method of a semiconductor device according to claim 3, wherein said slurry contains polishing particles the surface of which are treated by using a solution treatment.

5. A manufacturing method of a semiconductor device according to claim 3, wherein said metal wiring layer is a tungsten wiring layer.

* * * * *